US 8,295,134 B2

(12) United States Patent
Ikeda

(10) Patent No.: US 8,295,134 B2
(45) Date of Patent: Oct. 23, 2012

(54) OPTICAL DISC, OPTICAL DISC RECORDING METHOD AND APPARATUS, AND OPTICAL DISC REPRODUCING METHOD AND APPARATUS

(75) Inventor: Masakazu Ikeda, Odawara (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 189 days.

(21) Appl. No.: 12/603,111

(22) Filed: Oct. 21, 2009

(65) Prior Publication Data

US 2010/0103788 A1    Apr. 29, 2010

(30) Foreign Application Priority Data

Oct. 23, 2008  (JP) .................................. 2008-272603

(51) Int. Cl.
*G11B 20/12* (2006.01)
(52) U.S. Cl. .................. 369/47.15; 369/59.25
(58) Field of Classification Search .................. None
See application file for complete search history.

(56) References Cited

U.S. PATENT DOCUMENTS

| | | | | |
|---|---|---|---|---|
| 5,544,137 | A * | 8/1996 | Ohara et al. ................. | 369/47.5 |
| 5,987,066 | A | 11/1999 | Kojima et al. | |
| 6,879,637 | B1 * | 4/2005 | Nakagawa et al. ........... | 375/253 |
| 2002/0105885 | A1 | 8/2002 | Oki et al. | |
| 2003/0133387 | A1 | 7/2003 | Ishida et al. | |
| 2007/0280078 | A1 | 12/2007 | Tachino et al. | |

FOREIGN PATENT DOCUMENTS

| | | |
|---|---|---|
| EP | 0 779 623 A2 | 6/1997 |
| EP | 1 083 687 A1 | 3/2001 |
| JP | 09-162857 | 6/1997 |
| JP | 2002-184127 | 6/2002 |
| JP | 2002-304859 | 10/2002 |
| JP | 2007-035263 | 2/2007 |
| WO | WO 99/63671 | 12/1999 |

OTHER PUBLICATIONS

European Search Report issued in European Patent Application No. 09173934.2-1247, mailed Jan. 11, 2010.
ECMA: "Standard ECMA-359: DVD Recordable Disk (DVD-R) Standard ECMA-359", Internet Citation URL http://www.ecma-international.org/publications/files/ECMA-ST/Ecma-359.pdf, Dec. 2004, Subsections 1, 14.1-14.3, 15, 20, 21, 25.1.6.1, 26.
Annonymous, "Blue-ray disc Format 1.B Physical Format Specifications for BD-R", Internet Citation URL: http://www.blu-raydisc.com/assets/downloadablefile/1b_bdr_physicalformatspecifications-12839.pdf, Aug. 2004.
Chinese Office Action issued in 200910205781.7 on Feb. 28, 2011.

* cited by examiner

*Primary Examiner* — Christopher R Lamb
(74) *Attorney, Agent, or Firm* — McDermott Will & Emery LLP

(57) ABSTRACT

As a synchronization signal pattern to be added, a pattern is generated (second SYNC pattern), which has a pattern that breaks a maximum run inserted in a pattern excluding a minimum run is used so that intersymbol interference does not occur readily on a high-density disc, and addition processing of a conventional synchronization signal pattern (first SYNC pattern) is switched according to identification information indicating whether or not a high-density disc for generation.

7 Claims, 7 Drawing Sheets

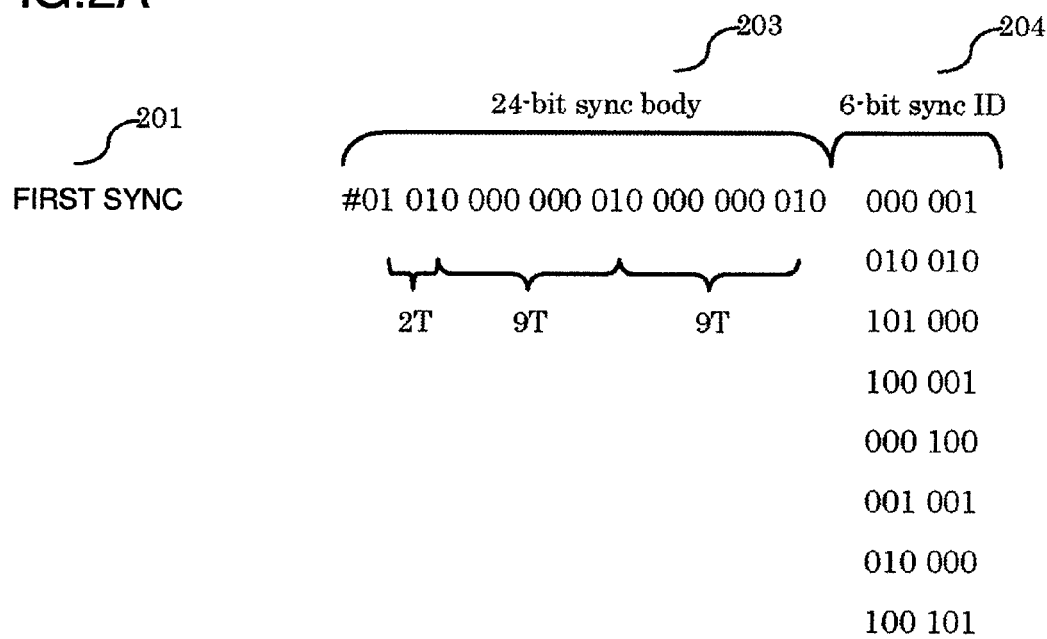
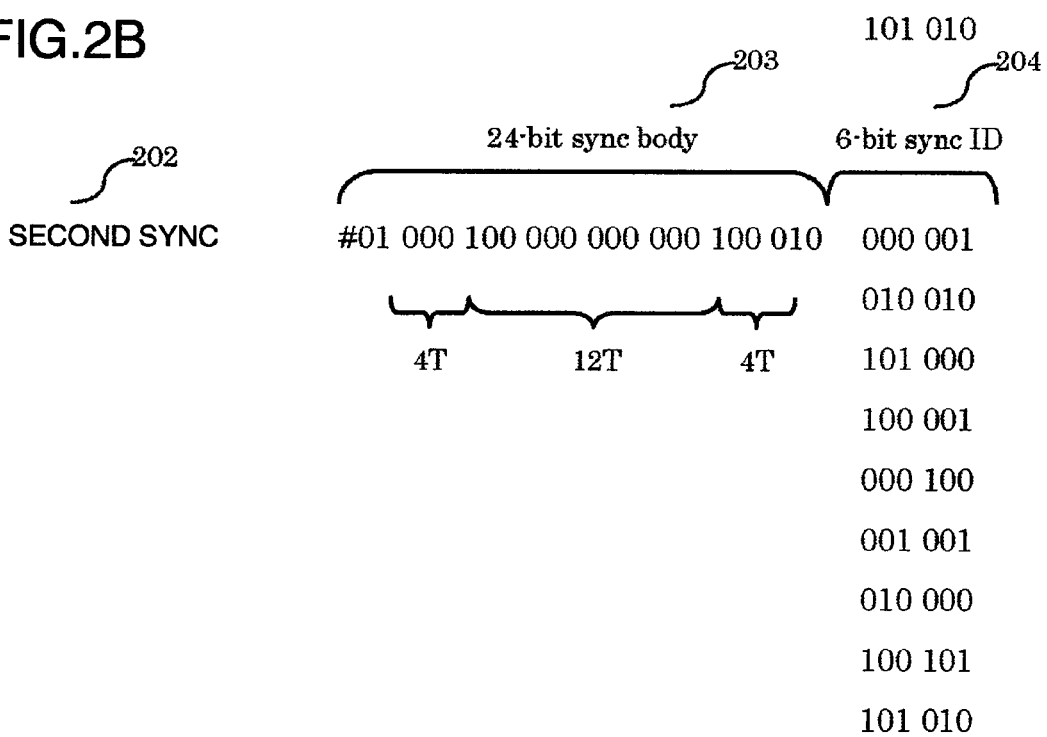

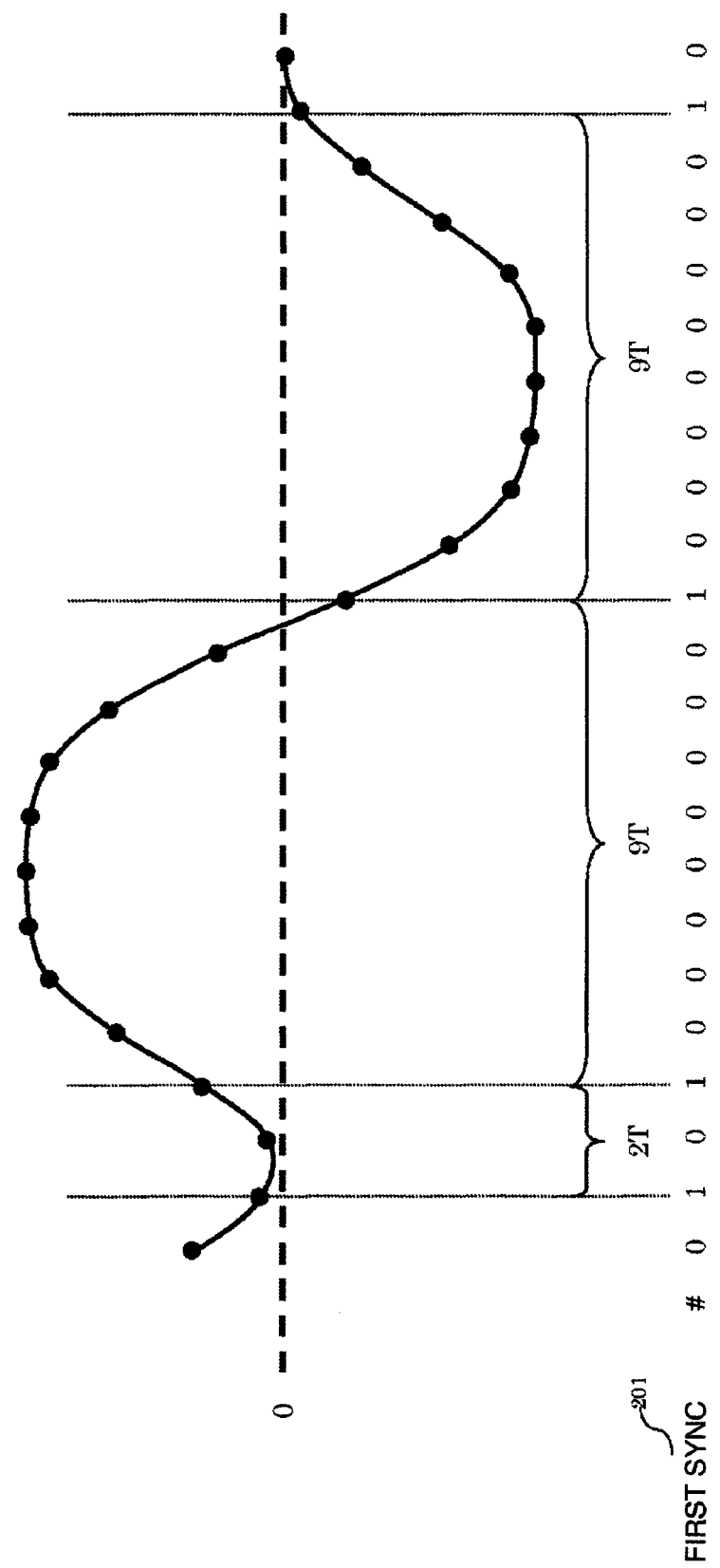

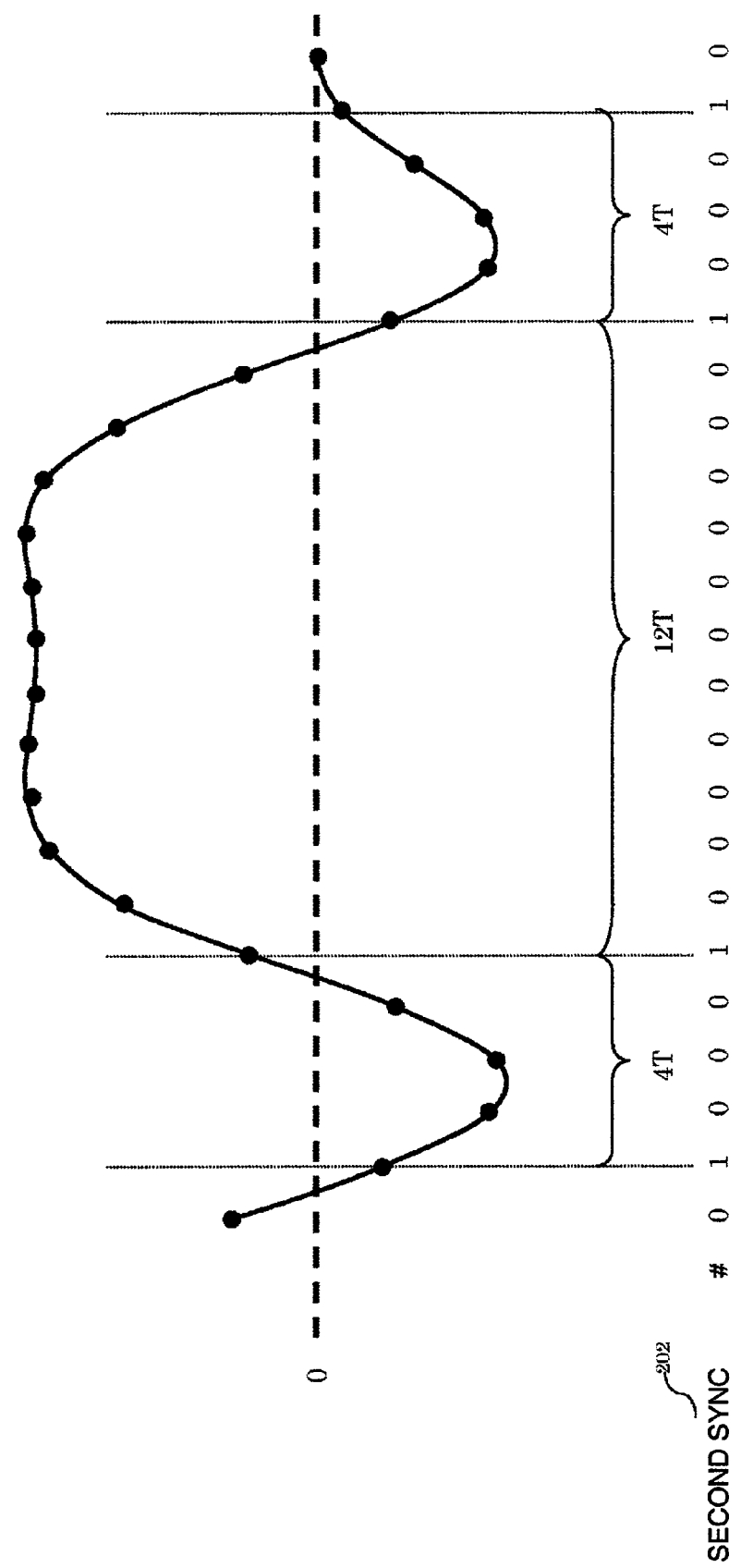

FIG.6A

| 24-bit sync body | 6-bit sync ID | | |
|---|---|---|---|
| #01 001 000 000 001 000 000 010 | sync ID | 3T—9T—8T | |
| #01 000 100 000 000 000 100 000 010 | sync ID | 4T—9T—7T | |
| #01 000 010 000 000 010 000 000 010 | sync ID | 5T—9T—6T | |
| #01 000 001 000 000 000 001 000 010 | sync ID | 6T—9T—5T | |
| #01 000 000 100 000 000 100 000 010 | sync ID | 7T—9T—4T | |
| #01 000 000 010 000 000 010 000 010 | sync ID | 8T—9T—3T | |
| #01 001 000 000 000 100 000 010 | sync ID | 3T—10T—7T | |
| #01 000 100 000 000 010 000 010 | sync ID | 4T—10T—6T | |
| #01 000 010 000 000 001 000 010 | sync ID | 5T—10T—5T | |
| #01 000 001 000 000 000 100 010 | sync ID | 6T—10T—4T | |
| #01 000 000 100 000 000 010 010 | sync ID | 7T—10T—3T | |

FIG.6B

| 24-bit sync body | 6-bit sync ID | | |
|---|---|---|---|
| #01 001 000 000 000 010 000 010 | sync ID | 3T—11T—6T | |
| #01 000 100 000 000 001 000 010 | sync ID | 4T—11T—5T | |
| #01 000 010 000 000 000 100 010 | sync ID | 5T—11T—4T | |
| #01 000 001 000 000 000 010 010 | sync ID | 6T—11T—3T | |
| #01 001 000 000 000 001 000 010 | sync ID | 3T—12T—5T | |
| #01 000 100 000 000 000 100 010 | sync ID | 4T—12T—4T | |
| #01 000 010 000 000 000 010 010 | sync ID | 5T—12T—3T | |
| #01 001 000 000 000 000 100 010 | sync ID | 3T—13T—4T | |
| #01 000 100 000 000 000 010 010 | sync ID | 4T—13T—3T | |
| #01 001 000 000 000 000 010 010 | sync ID | 3T—14T—3T | |

OPTICAL DISC, OPTICAL DISC RECORDING METHOD AND APPARATUS, AND OPTICAL DISC REPRODUCING METHOD AND APPARATUS

INCORPORATION BY REFERENCE

The present application claims priority from Japanese application JP2008-272603 filed on Oct. 23, 2008, the content of which is hereby incorporated by reference into this application.

BACKGROUND

The present invention relates to a recording medium such as an optical disc, an optical disc recording method and apparatus, and an optical disc reproducing method and apparatus.

A synchronization signal pattern in a frame unit of a Blu-ray Disc is disclosed in Table 6 of JP-A-2007-35263, and its paragraph [0060] describes the characteristics of the synchronization signal pattern, as "(1) (Tmax+1)–(T max+1), namely 9T-9T is given. Thus, since the pattern which breaks a maximum run is continued twice, the detection ability can be enhanced." and "(2) 2T is given so that Tmax does not appear whatever a data modulation sequence is before 9T-9T. In other words, a short run is inserted so that no pattern of 8T-9T-9T appears in combination with a data part immediately preceding a synchronization signal to be inserted."

JP-A-9-162857 describes, "The synchronous frame comprises a synchronization signal and a run length limited code which fills restrictions of a minimum run length and a maximum run length, and the synchronization signal includes the synchronization pattern constituted by a bit pattern of a run length that is longer than the maximum run length by only 3T and an addition bit pattern of a run length longer than the minimum run length which is arranged before and after the bit pattern."

SUMMARY

A synchronization (hereinafter referred to as SYNC) signal pattern adopted for a Blu-ray Disc is constituted by a pattern 2T-9T-9T, and possibly 2T-9T-9T-2T having a special pattern of 9T-9T adjacent to 2T. The inventors have found that in a case where intersymbol interference occurs in a reproducing signal waveform on a high-density disc or the like, there is generated a new problem that a synchronization signal period cannot be detected correctly. It was found that the new problem is susceptible to an influence when a run is shorter, and especially a 2T reproducing waveform which is a minimum run of Blu-ray suffers from a phenomenon that no zero cross occurs, and in a case where a signal width is detected from the reproducing waveform by a slice or the like according to a zero cross, it is connected with adjacent runs, and a signal width larger than the original is detected. Especially, the synchronization signal pattern 2T-9T-9T shown in JP-A-2007-35263 tends to be detected incorrectly.

For the current Blu-ray Disc, 2T-9T-9T is being adopted as a synchronization signal pattern. Therefore, to adopt a different synchronization signal pattern for the future high-density Blu-ray Disc, it is necessary to ensure the compatibility with the conventional discs. Such a point is not considered in JP-A-9-162857 at all.

Conventionally, discs which are recorded by a laser beam having the same wavelength do not have a different synchronization signal pattern.

The present invention provides an optical disc recording method which has compatibility with intersymbol interference taken into consideration, and an optical disc reproducing method.

Objects of the invention can be achieved by adopting as an example a recording method and a reproducing method considering a synchronization signal capable of reducing intersymbol interference.

The present invention provides an optical disc recording method and an optical disc reproducing method having compatibility with intersymbol interference taken into consideration.

Other objects, features and advantages of the invention will become apparent from the following description of the embodiments of the invention taken in conjunction with the accompanying drawings.

BRIEF DESCRIPTION OF THE DRAWINGS

FIG. 2A and FIG. 2B are synchronization signal pattern diagrams of the optical disc according to the first embodiment of the invention.

FIG. 3 is a reproducing waveform diagram of a first SYNC pattern of a high-density disc.

FIG. 4 is a reproducing waveform diagram of a second SYNC pattern of a high-density disc.

FIG. 6A and FIG. 6B are pattern examples of the second SYNC pattern.

DESCRIPTION OF THE EMBODIMENTS

Embodiments of the invention will be described below with reference to the drawings.

Figure 1:
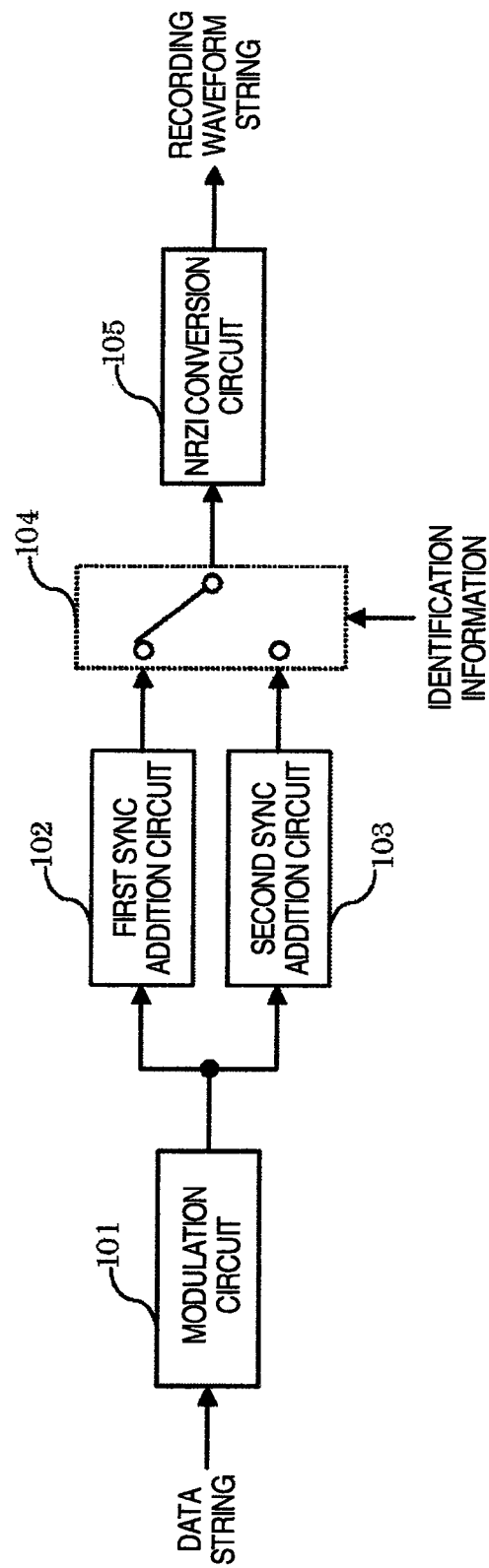
FIG. 1 is a detail view of a modulation apparatus in an optical disc recording apparatus according to a first embodiment of the invention.

FIG. 1 is an optical disc recording apparatus according to a first embodiment of the invention and shows a detail view of a modulation apparatus which converts the encoded data string at the time of recording into a recording waveform string. In the drawing, 101 denotes a modulation circuit for performing modulation processing according to a predetermined modulation rule, 102 and 103 denote a first SYNC addition circuit and a second SYNC addition circuit which add a different synchronization signal pattern, 104 denotes a changeover switch, and 105 denotes an NRZI conversion circuit for level coding of a generated code word.

FIG. 2A and FIG. 2B show examples of synchronization signal patterns added by the first SYNC addition circuit 102 and the second SYNC addition circuit 103. A first SYNC pattern 201 of FIG. 2A is a synchronization signal pattern of a conventional Blu-ray Disc and composed of a 24-bit sync body 203 and a 6-bit sync ID 204. The sync body 203 is composed of repetition of 9T which is a pattern to break the maximum run 8T subsequent to 2T which is a minimum run determined according to a modulation rule of the Blu-ray Disc. And, the sync ID 204 is composed of plural kinds of patterns to identify a frame position. In a case where a conventional disc is recorded, data generated according to a predetermined encoding rule is inputted as a data string to the modulation apparatus of FIG. 1. In the modulation apparatus, the data string is undergone modulation processing by the modulation circuit 101 according to a predetermined modulation rule, the synchronization signal pattern 201 shown in FIG. 2A is added by the first SYNC addition circuit 102 to generate a code word, which is undergone NRZI conversion by the NRZI conversion circuit 105 to make level coding, and its recording waveform string is outputted to record on the disc.

But, when data which is recorded on a high-density disc with addition of the conventional synchronization signal (first SYNC pattern) is reproduced, intersymbol interference appears prominently due to the influence of transmission characteristics. FIG. 3 shows a reproducing waveform of the first SYNC pattern 201 of a high-density disc equivalent to a 33-GB single layer Blu-ray Disc. As shown in FIG. 3, since a part which is originally 2T becomes not to cross a zero level, it becomes impossible to identify between 2T and 9T when a signal width is detected by a slice of zero level, and it becomes impossible to detect correct 9T and a correct synchronization signal pattern. Therefore, false detection of the synchronization signal pattern occurs frequently, and it becomes impossible to synchronize correctly in a frame unit. And, a synchronization signal different from the conventional synchronization signal is added so that the intersymbol interference does not occur readily on the high-density disc. Considering the compatibility with the conventional discs, a change in 20T of a 2T-9T-9T turn within the 24-bit sync body 203 is described as an example. A second SYNC pattern 202 in FIG. 2B is an example of the synchronization signal pattern of the high-density disc. For example, as a construction such as 4T-12T-4T that a pattern (12T here) that breaks the maximum run 8T is inserted between patterns (4T here) excluding a minimum run 2T, it is determined that another bit such as a 6-bit sync ID 204 is the same as the conventional synchronization signal pattern. FIG. 4 shows a reproducing waveform of the second SYNC pattern 202 of the high-density disc. As shown in FIG. 4, 4T and 12T used as a synchronization signal pattern become hard to generate intersymbol interference, and it is easy to detect a signal width normally by the zero level slice. It is easy to deal with the generation of a recording waveform string on the high-density disc by using FIG. 1. Identification information indicating whether or not the disc is a high-density disc shall be recorded in an area where disc information on the disc is stored. In addition to the medium identification at the time of disc discrimination, it is determined to switch the processing by identifying whether or not the disc is a high-density disc. A difference between the conventional disc and the high-density disc is only a pattern of the synchronization signal added at a time of encoding. Therefore, the output of the addition circuit is switched by the changeover switch 104 according to the identification information obtained by disc identification so that another synchronization signal pattern (second SYNC pattern) is added instead of the conventional synchronization signal pattern (first SYNC pattern). Thus, the data generated according to the predetermined encoding rule is inputted as a data string to the modulation apparatus of FIG. 1. The data string is undergone modulation processing by the modulation circuit 101 according to the predetermined modulation rule. The synchronization signal shown in FIG. 2B is added by the second SYNC addition circuit 103 to generate a code word. And, the NRZI conversion circuit 105 performs NRZI conversion to make level coding and outputs as a recording waveform string to record on a disc.

Figure 5:
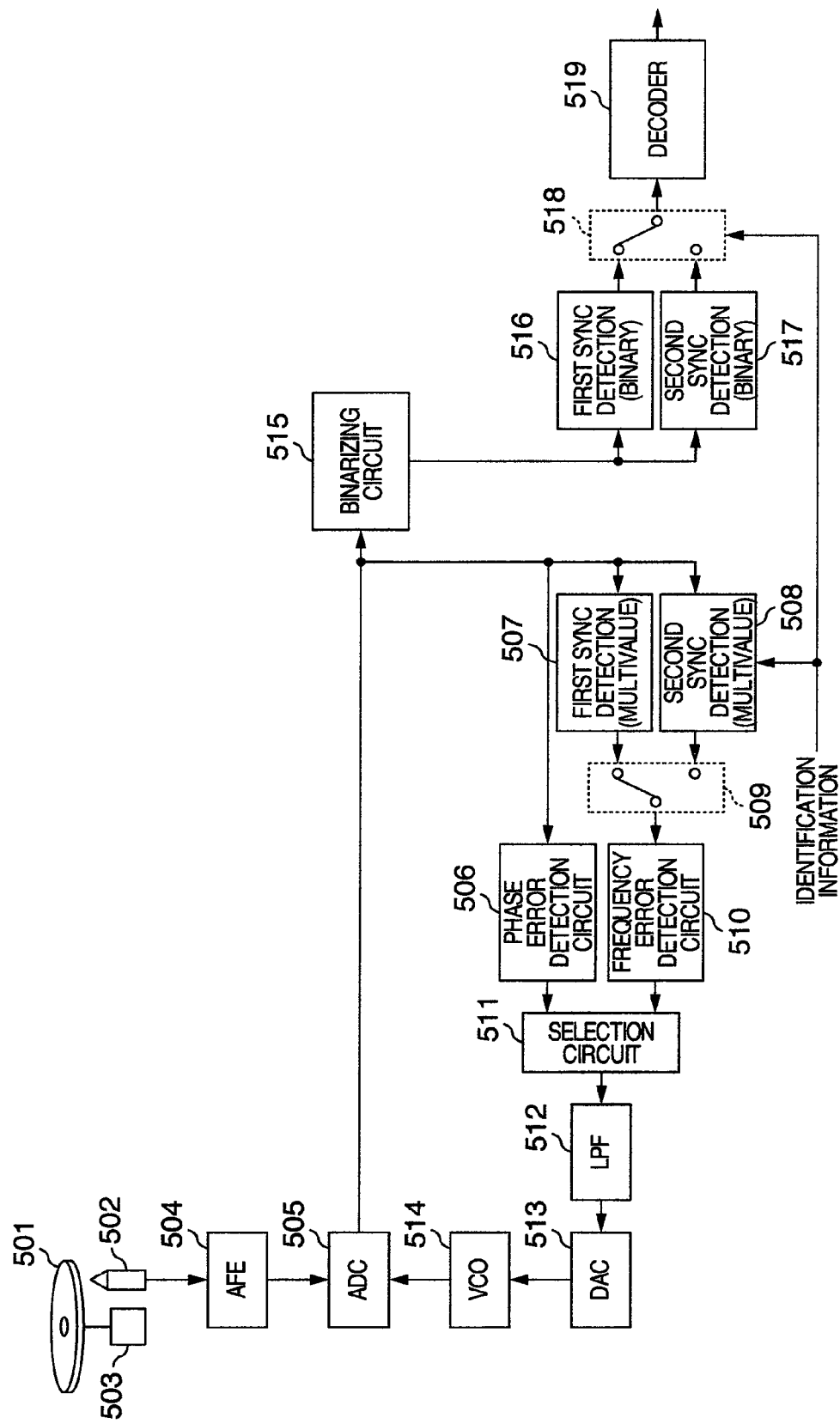
FIG. 5 is an optical disc reproducing apparatus according to the first embodiment of the invention.

The optical disc recorded by the optical disc recording apparatus described in the first embodiment can be reproduced by the optical disc reproducing apparatus as shown in FIG. 5. Numeral 501 denotes an optical disc which corresponds to either a conventional synchronization signal pattern (first SYNC pattern) or a high-density disc-corresponding synchronization signal pattern (second SYNC pattern) and on which recorded is identification information indicating whether or not the disc is a high-density disc. Numeral 502 denotes a pickup, 503 denotes a spindle motor, 504 denotes an analog front end (hereinafter referred to as AFE), 505 denotes an A/D converter (hereinafter referred to as ADC), 506 denotes a phase error detection circuit, 507 denotes a first SYNC detection circuit (multiple values), 508 denotes a second SYNC detection circuit (multiple values), 509 denotes a changeover switch, 510 denotes a frequency error detection circuit, 511 denotes a selection circuit, 512 denotes a loop filter (hereinafter referred to as LPF), 513 denotes a D/A converter (hereinafter referred to as DAC), 514 denotes a voltage controlled oscillator (hereinafter referred to as VCO), 515 denotes a binarizing circuit, 516 denotes a first SYNC detection circuit (binary), 517 denotes a second SYNC detection circuit (binary), 518 denotes a changeover switch, and 519 denotes a decoder.

A reproducing operation by the optical disc reproducing apparatus of this embodiment is briefly described below. The signal read from the optical disc 501 via the optical pickup 502 is undergone an analog process by the AFE 504 and inputted to the ADC 505. The signal digitized to multivalue information by the ADC 505 is inputted to the phase error detection circuit 506 which detects a phase error according to data displacement at an edge of the reproducing waveform, to the first SYNC detection circuit 507 which detects a first synchronization signal pattern from the reproducing waveform (multivalue information) and to the second SYNC detection circuit 508 which detects a second synchronization signal pattern. Here, as disc information which is read when the disc is inserted, the output of the detected result of a synchronization signal based on the identification information indicating whether or not the disc is a high-density disc is switched by the changeover switch 509 and inputted to the frequency error detection circuit 510. The frequency error detection circuit 510 detects a frequency error from the width and detection cycle of the detected synchronization signal. Error data obtained by the phase error detection circuit 506 or the frequency error detection circuit 510 is selected by the selection circuit 511, a high-frequency component is removed by the LPF 512, analogization is performed by the DAC 513, and the result is inputted to the VCO 514. The VCO 514 adjusts the cycle and phase of a sampling clock of the ADC 505 to compensate a phase difference and a frequency difference depending on the obtained error information. As described above, the output of the ADC 505 sampled is decoded from multivalue reproducing waveform data to binary data in synchronization with the inputted data by the binarizing circuit 515 using maximum likelihood decoding or the like. The decoded binary data is inputted by the first SYNC detection circuit 516 and the second SYNC detection circuit 517 to detect individual synchronization signal patterns. According to the identification information indicating whether or not the disc is a high-density disc, the output of the detected result of the synchronization signal is switched by the changeover switch 518 and outputted. The decoder 519 uses the frame position information detected from the detected synchronization signal to perform demodulation processing of the binarized data, error correction processing, descramble processing, and external data output processing. Here, the difference between the conventional optical disc and the high-density optical disc is only the synchronization signal pattern which is buried in the recording waveform string, so that only the synchronization signal pattern to be detected is switched, and other calculation processing such as the demodulation processing can be used in common. The embodiment was described with reference to the structure of data PLL which generates a clock in synchronization with the data phase but not limited to this structure.

As described above, this embodiment uses as the synchronization signal pattern of the high-density disc a pattern which is inserted in the pattern excepting a minimum run to switch from the conventional synchronization signal pattern to the pattern that breaks a maximum run to perform addition and generation. Thus, a synchronization signal can be detected stably from the high-density disc which tends to cause the intersymbol interference.

Since the embodiment was described with reference to the provision of a high density equivalent to a 33-GB single layer Blu-ray Disc, it was assumed that 2T where the detection of run length became impossible was not adjacent to the synchronization signal pattern, and the 4T-12T-4T was used as an example. But, if both sides of a pattern that breaks the maximum run 8T can be composed of a long run enough not to easily cause intersymbol interference, a similar construction can be made. FIG. 6A and FIG. 6B show examples of a 20-bit synchronization signal pattern. When the synchronization signal patterns shown in FIG. 6A and FIG. 6B are used as the second SYNC patterns of FIG. 1 and FIG. 2B, a similar structure can be made as another example of the first embodiment. But, a 5T-9T-6T synchronization signal pattern having a construction that a 9T pattern, which is adopted to the conventional optical disc, is inserted between 5T and 6T or the like may be considered, but when 9T is detected for detection of a synchronization signal pattern, it is easily mistaken as the maximum run 8T. Therefore, detection capability can be enhanced when it is sufficiently separated as a pattern, that breaks the maximum run, from 8T. And, if the run length which becomes undetectable by the provision of higher density becomes larger than 2T, the same construction can be made by using the pattern example of FIGS. 6A and 6B excluding the pattern including the run length which becomes undetectable by provision of higher density.

Considering compatibility with the conventional disc recording/reproducing, the embodiment was described as a construction that addition/detection of the conventional synchronization signal pattern (first SYNC pattern) 201 and the synchronization signal pattern (second SYNC pattern) 202 of the high-density disc were switched. But, as a recording/reproducing apparatus for only the high-density disc, the same construction can be realized by only an addition/detection circuit of the synchronization signal pattern (second SYNC pattern) 202 of the high-density disc.

Figure 7A:
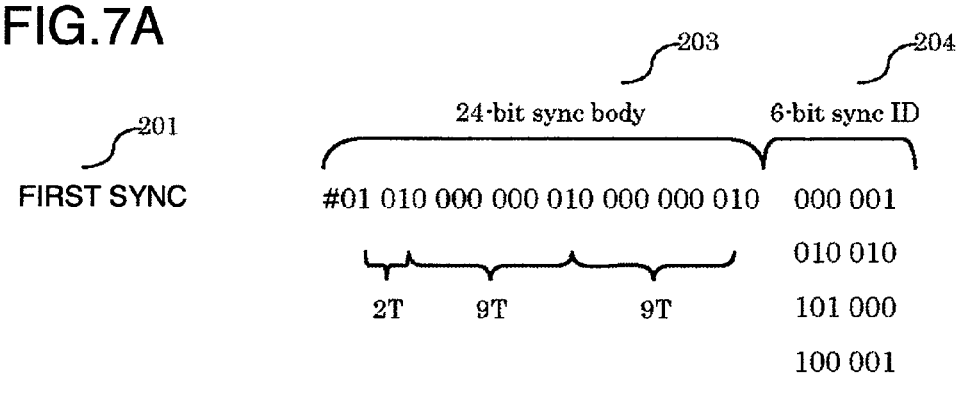
FIG. 7A and FIG. 7B are synchronization signal pattern diagrams of the optical disc according to a second embodiment of the invention.
Figure 7B:
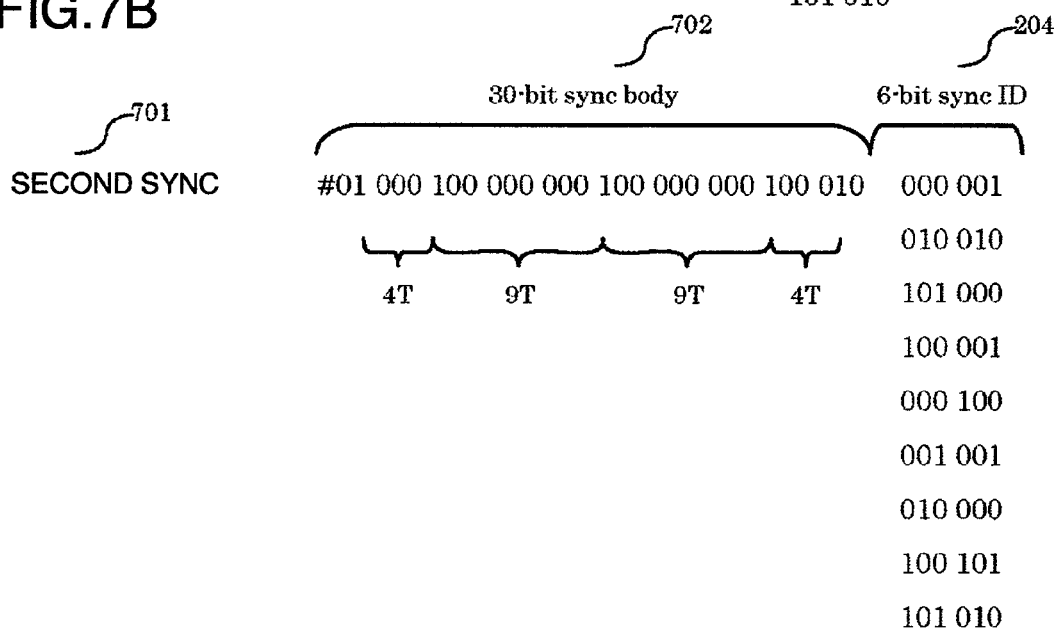

FIG. 7A and FIG. 7B are examples of the synchronization signal pattern to be added to a recording waveform string at a time of modulation processing for optical disc recording of a second embodiment of the invention. A difference from FIG. 2 A and FIG. 2B is that a 4T-9T-9T-4T pattern is used as a second SYNC pattern 701 instead of 4T-12T-4T. The second SYNC pattern 701 of this embodiment has a 4T pattern buried such that both ends of a 9T-9T repetition pattern same as the first SYNC pattern do not become 2T and is composed of a 30-bit sync body 702. The pattern which is detected by the second SYNC pattern 701 is a 9T-9T pattern and not different from the first SYNC pattern 201, but an appearance cycle of the 9T-9T pattern is varied with a bit increase of the sync body. Therefore, in the addition/detection of the first SYNC pattern 201 and the second pattern 701, it can be dealt with by switching not only the addition/detection pattern but also the addition/detection timing.

The first embodiment and the second embodiment were described with reference to an optical disc as a recording/reproducing medium. But, they are not limited to the optical disc and can also be applied similarly to other information recording media.

As described above, an optical disc recording apparatus according to one embodiment is as follows:

An optical disc recording apparatus which configures a frame with a synchronization signal added for each predetermined data unit and records on an optical disc (501) with modulation made according to a modulation rule which limits the run length to cause frame data to have a maximum run and a minimum run, comprising:

means for adding a synchronization signal which is composed of a pattern excluding the minimum run to both ends of a pattern that breaks the maximum run.

Further, an optical disc recording apparatus according to another embodiment is as follows:

An optical disc recording apparatus in which a frame is configured by adding a synchronization signal to each predetermined data unit and frame data is record on an optical disc (501) with modulation made according to a modulation rule which limits the run length to cause frame data to have a maximum run and a minimum run, wherein:

the optical disc recording apparatus:

records on a first optical disc which is recorded with addition of a first synchronization signal composed of a repetition pattern of a pattern that breaks the maximum run subsequent to the minimum run and on a second optical disc which is recorded with addition of a second synchronization signal composed of a pattern excluding the minimum run at both ends of the pattern that breaks the maximum run, records identification information for identifying each disc on the first optical disc and the second optical disc, and has means (101) for modulating a predetermined data string, means (102) for adding a first synchronization signal, means (103) for adding a second synchronization signal, means (104) for switching between the outputs of the first synchronization signal adding means (103) and the second synchronization signal adding means (104) according to the identification information, and means (105) for converting the output of the changeover means (104) to a recording waveform string.

Further, an optical disc recording apparatus according to another embodiment is as follows:

An optical disc reproducing apparatus which configures a frame by adding a synchronization signal to each predetermined data unit and reproduces an optical disc (501) modulated according to a modulation rule which limits a run length to cause frame data to have a maximum run and a minimum run, comprising:

means for detecting a synchronization signal which is composed of a pattern excluding the minimum run at both ends of a pattern that breaks the maximum run.

Further, an optical disc recording apparatus according to another embodiment is as follows:

An optical disc reproducing apparatus which configures a frame by adding a synchronization signal to each predetermined data unit and reproduces an optical disc (501) modulated according to a modulation rule which limits a run length to cause frame data to have a maximum run and a minimum run, wherein:

the optical disc reproducing apparatus:

reproduces a first optical disc which is recorded with addition of a first synchronization signal composed of a repetition pattern of a pattern that breaks the maximum run subsequent to the minimum run and a second optical disc which is recorded with addition of a second synchronization signal composed of a pattern excluding the minimum run at both ends of the pattern that breaks the maximum run, records identification information for identifying each disc on the first optical disc and the second optical disc, and has means for reading data recorded on the optical disc (501), means (505) for performing analog/digital conversion of the output signal of the reading means at a predetermined clock, means (506) for detecting a phase error according to the output data of the analog/digital conversion means (505), means for detecting each of a first synchronization signal pattern and a second synchronization signal pattern from the multivalue output data of the analog/digital conversion means (505), means for switching between the outputs of the first synchronization signal pattern detected result and the second synchronization signal pattern detected result, means for detecting a frequency error from the synchronization signal detected result which is the output of the changeover means (509), and means for oscillating the clock by being controlled according to the output data of the phase error detection means (506) and the frequency error detection means (510), wherein:

the detected results of the multivalue synchronization signal patterns are switched according to the disc identification information.

Further, an optical disc recording apparatus according to another embodiment is as follows:

An optical disc reproducing apparatus which configures a frame by adding a synchronization signal to each predetermined data unit and reproduces an optical disc (501) modulated according to a modulation rule which limits the run length to cause frame data to have a maximum run and a minimum run, wherein:

the optical disc reproducing apparatus:

reproduces a first optical disc which is recorded with addition of a first synchronization signal composed of a repetition pattern of a pattern that breaks the maximum run subsequent to the minimum run and a second optical disc which is recorded with addition of a second synchronization signal composed of a pattern excluding the minimum run at both ends of the pattern that breaks the maximum run, and has means for reading data recorded on the optical disc (501), means (505) for performing analog/digital conversion of the output signal of the reading means at a predetermined clock, means (515) for converting the multivalue output data of the analog/digital conversion means (505) to binary data, means (516, 517) for detecting each of a first synchronization signal pattern and a second synchronization signal pattern from the binary output data of the binary conversion means, means (518) for switching between the outputs of the first synchronization signal pattern detected result and the second synchronization signal pattern detected result, and means (519) for demodulating data according to the synchronization signal detected result which is the output of the changeover means (518), wherein:

the detected results of the binary synchronization signal patterns are switched according to the disc identification information.

Further, an optical disc recording apparatus according to another embodiment is as follows:

An optical disc recording apparatus which configures a frame with a synchronization signal added for each predetermined data unit and records on an optical disc (501) by modulating according to a modulation rule which limits a run length to cause frame data to have a maximum run and a minimum run, comprising:

means for adding a synchronization signal composed of a pattern excluding the minimum run to both ends of a repetition of a pattern that breaks the maximum run.

Further, an optical disc reproducing apparatus according to another embodiment is as follows:

An optical disc reproducing apparatus which configures a frame by adding a synchronization signal to each predetermined data unit and reproduces an optical disc (501) modulated according to a modulation rule which limits the run length to cause frame data to have a maximum run and a minimum run, comprising:

means for detecting a synchronization signal which is composed of a pattern excluding the minimum run at both ends of a repetition of a pattern that breaks the maximum run.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An optical disc recording method, wherein a frame is configured by adding a synchronization signal to each predetermined data unit, and frame data modulated according to a modulation rule, which limits the run length to cause frame data to have a maximum run and a minimum run, is recorded on an optical disc by a laser beam, comprising a step of:

reading, from the optical disc, identification information indicating whether the optical disc is a disc to be recorded with a first synchronization signal added or a disc to be recorded with a second synchronization signal added, wherein:

the identification information is information for identifying that a different synchronization signal is added according to the same modulation rule;

a pattern of the first synchronization signal is composed of a repetition pattern of a first pattern that breaks the maximum run subsequent to the minimum run;

a pattern of the second synchronization signal is composed of a pattern at both ends of a second pattern that breaks the maximum run;

the pattern of the first synchronization signal and the pattern of the second synchronization signal have the same length; and the laser beam is used to record with the first synchronization signal added or to record with the second synchronization signal added according the identification information.

2. The optical disc recording method according to claim 1, wherein:

the pattern of the second synchronization signal is composed of a pattern excluding the minimum run at both ends of the second pattern that breaks the maximum run; and the pattern excluding the minimum run has a run length that the run detection of a reproducing waveform string does not become difficult.

3. An optical disc reproducing method for reproducing data recorded on an optical disc by a laser beam, comprising:

reading, from the optical disc, identification information indicating whether or not the disc is a disc recorded with a first synchronization signal added or a disc recorded with a second synchronization signal of a second pattern added, wherein:

the identification information is information for identifying that a different synchronization signal is added according to the same modulation rule;

a pattern of the first synchronization signal is composed of a repetition pattern of a first pattern that breaks the maximum run subsequent to the minimum run;

a pattern of the second synchronization signal is composed of a pattern at both ends of a second pattern that breaks the maximum run;

the pattern of the first synchronization signal and the pattern of the second synchronization signal have the same length; and the laser beam is used to detect the first synchronization signal or the second synchronization signal according to the identification information.

4. The optical disc reproducing method according to claim 3, wherein:

the pattern of the second synchronization signal is composed of a pattern excluding the minimum run at both ends of the second pattern that breaks the maximum run, and the pattern excluding the minimum run has a run length that the run detection of a reproducing waveform string does not become difficult.

5. An optical disc recording method, wherein a frame is configured by adding a synchronization signal to each predetermined data unit and frame data is recorded on an optical disc with modulation made according to a modulation rule which limits the run length to cause frame data to have a maximum run and a minimum run, comprising:

adding a first synchronization signal to each predetermined data unit when the optical disc includes first identification information; and adding a second synchronization data unit when the optical disc includes second identification information, wherein:

a pattern of the first synchronization signal is composed of a repetition pattern of a first pattern that breaks the maximum run subsequent to the minimum run;

a pattern of the second synchronization signal is composed of a pattern excluding the minimum run at both ends of a second pattern that breaks the maximum run; and the pattern of the first synchronization signal and the pattern of the second synchronization signal have the same length.

6. The optical disc recording method according to claim 5, wherein the pattern excluding the minimum run configures the second synchronization signal to have a run length that the run detection of a reproducing waveform string does not become difficult.

7. An optical disc reproducing method which configures a frame with a synchronization signal added for each predetermined data unit and reproduces an optical disc which is modulated according to a modulation rule which limits a run length to cause frame data to have a maximum run and a minimum run, comprising:

retrieving identification information from the optical disc;

detecting a first synchronization signal when the identification information indicates that the disc includes the first synchronization signal; and detecting a second synchronization signal when the identification information indicates that the disc includes the second synchronization signal, wherein:

a pattern of the first synchronization signal is composed of a repetition pattern of a first pattern that breaks the maximum run subsequent to the minimum run;

a pattern of the second synchronization signal is composed of a pattern excluding the minimum run at both ends of a second pattern that breaks the maximum run; and the pattern of the first synchronization signal and the pattern of the second synchronization signal have the same length.

* * * * *